United States Patent
Willer et al.

(10) Patent No.: US 6,646,299 B2
(45) Date of Patent: Nov. 11, 2003

(54) INTEGRATED CIRCUIT CONFIGURATION HAVING AT LEAST TWO CAPACITORS AND METHOD FOR MANUFACTURING AN INTEGRATED CIRCUIT CONFIGURATION

(75) Inventors: Josef Willer, Riemerling (DE); Christofer Hierold, Zürich (CH)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/126,365

(22) Filed: Apr. 19, 2002

(65) Prior Publication Data

US 2002/0149043 A1 Oct. 17, 2002

Related U.S. Application Data

(63) Continuation of application No. PCT/DE00/03521, filed on Oct. 6, 2000.

(30) Foreign Application Priority Data

Oct. 19, 1999 (DE) ......................... 199 50 364

(51) Int. Cl.[7] ................. H01L 27/08; H01L 29/76; H01L 29/94; H01L 31/119
(52) U.S. Cl. ..................... 257/306; 257/309
(58) Field of Search ................ 257/295–310; 438/253–254, 396–398

(56) References Cited

U.S. PATENT DOCUMENTS 5,633,781 A     5/1997  Saenger et al.
5,801,079 A  *  9/1998  Takaishi ............... 438/396
6,030,866 A  *  2/2000  Choi .................... 438/253

FOREIGN PATENT DOCUMENTS

EP    0 838 852 A2    4/1998
WO    WO 00/55904    9/2000

OTHER PUBLICATIONS

Horii, H. et al.: "A Self–aligned Stacked Capacitor using Novel Pt Electroplating Method for 1 Gbit DRAMs and Beyond", XP–002 161 639, Symposium on VLSI Technology Digest of Technical Papers, 1999, pp. 103–104.

* cited by examiner

Primary Examiner—Cuong Quang Nguyen
(74) Attorney, Agent, or Firm—Laurence A. Greenberg; Werner H. Stemer; Gregory L. Mayback

(57) ABSTRACT

A first capacitor electrode and at least part of a second capacitor electrode of a capacitor are produced in depressions of an auxiliary layer by electroplating. The auxiliary layer is then removed and at least partially replaced by a capacitor dielectric. The first capacitor electrode and the part of the second capacitor electrode may be composed of a metal, for example platinum. The capacitor dielectric can be composed, for example, of barium-strontium-titanate.

12 Claims, 3 Drawing Sheets

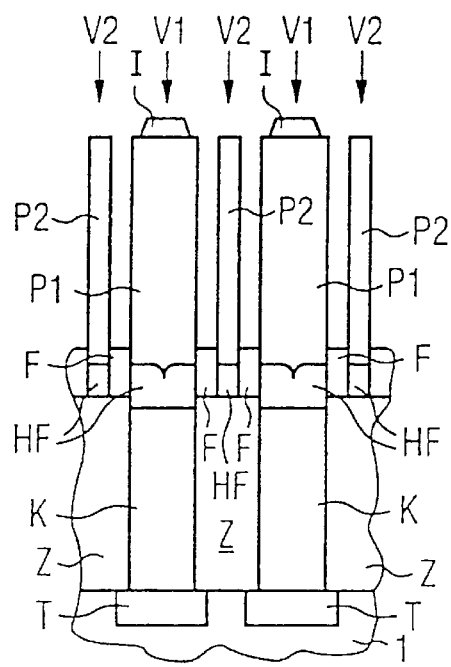
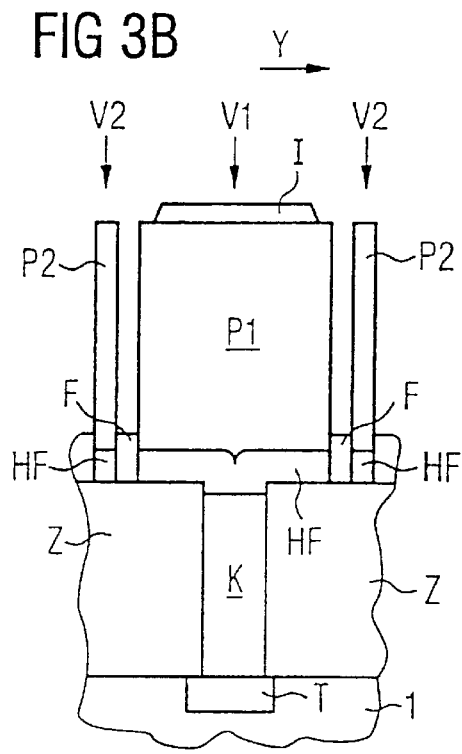
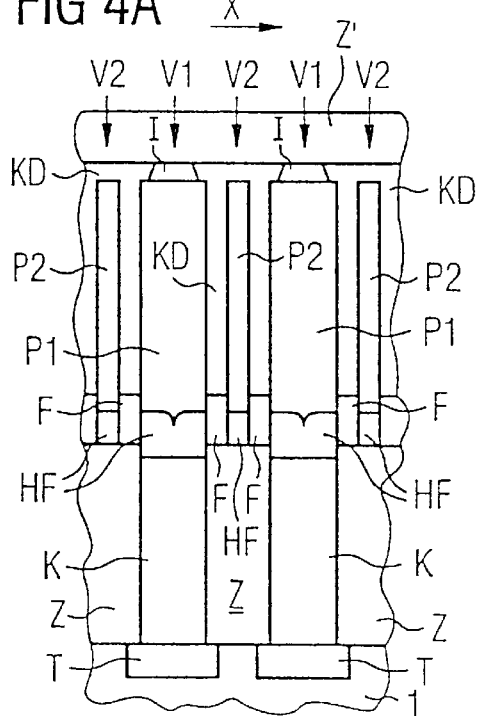
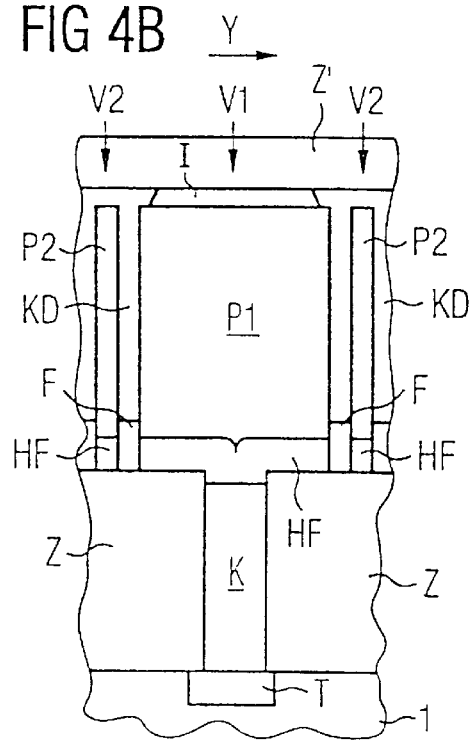

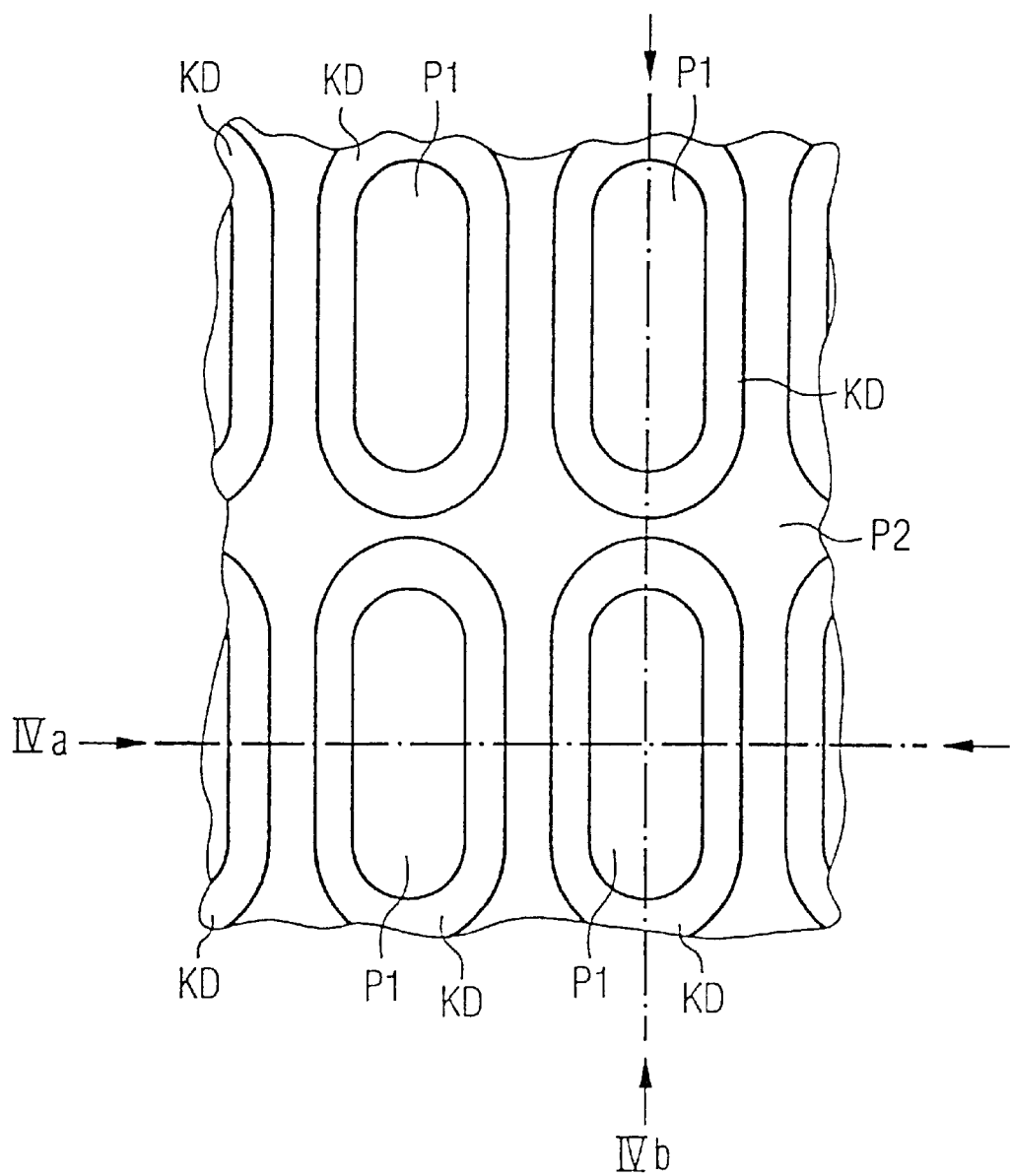

INTEGRATED CIRCUIT CONFIGURATION HAVING AT LEAST TWO CAPACITORS AND METHOD FOR MANUFACTURING AN INTEGRATED CIRCUIT CONFIGURATION

CROSS-REFERENCE TO RELATED APPLICATION

This application is a continuation of copending International Application No. PCT/DE00/03521, filed Oct. 6, 2000, which designated the United States.

BACKGROUND OF THE INVENTION

Field of the Invention

The invention relates to an integrated circuit configuration, that is to say a circuit configuration which is provided in a substrate, wherein the integrated circuit configuration includes at least two capacitors. The invention further relates to a method of producing such an integrated circuit configuration.

Such an integrated circuit configuration is, for example, a DRAM (Dynamic Random Access Memory) cell configuration with memory cells which have a capacitor and a transistor connected thereto. The information of the memory cell is stored in the form of a charge in the capacitor. When the transistor is driven via a wordline, the charge of the capacitor can be read out via a bit line.

In order to increase the capacitance of the capacitor while the capacitor at the same time requires little space, it is proposed, for example, in H. Horii et al. "A Self-aligned Stacked Capacitor using Novel Pt Electroplating Method for 1 Gbit DRAMs and Beyond", Symposium on VLSI Technology Digest of Technical Papers (1999), 103, to use barium-strontium-titanate (BST) as the capacitor dielectric. BST has a very high dielectric constant. Platinum is used as the material of a cylindrical first capacitor electrode of the capacitor. Because platinum is difficult to structure through the use of dry etching, the first capacitor electrode is grown through the use of electroplating. For this purpose, a depression is produced in a first insulating layer. A 40 nm thick adhesive layer made of ruthenium is then deposited. A second insulating layer is then produced and patterned in such a way that the depression is exposed. As a result of electroplating, platinum grows on the adhesive layer and fills the depression in the first insulating layer and in the second insulating layer. The parts of the adhesive layer which expose the second insulating layer are then removed. To produce a capacitor dielectric, BST is then applied to a thickness of 40 nm by sputtering. No information is given on the necessary second capacitor electrode.

SUMMARY OF THE INVENTION

It is accordingly an object of the invention to provide an integrated circuit configuration with at least two capacitors which overcomes the above-mentioned disadvantages of the heretofore-known integrated circuit configurations of this general type and which can be manufactured without dry etching of metal which is difficult to etch in order to produce capacitor electrodes, and which allows to form the capacitor dielectric of a perovskite. It is a further object of the invention to provide a method of manufacturing such an integrated circuit configuration.

With the foregoing and other objects in view there is provided, in accordance with the invention, an integrated circuit configuration, including:

a substrate having a surface;

at least two capacitors provided on the surface of the substrate;

each of the capacitors having a first capacitor electrode, a second capacitor electrode, and a capacitor dielectric;

the first capacitor electrode and at least a given part of the second capacitor electrode having respective lateral faces, the first capacitor electrode and the second capacitor electrode being disposed such that only the respective lateral faces of the first capacitor electrode and of at least the given part of the second capacitor electrode are opposite one another;

the first capacitor electrode and the given part of the second capacitor electrode being composed of a material that is hard to etch;

the capacitor dielectric being composed of a perovskite and being disposed between the lateral faces of the first capacitor electrode and of the given part of the second capacitor electrode disposed opposite one another;

the first capacitor electrode being substantially composed of a given metal, the second capacitor electrode being configured such that only the given part of the second capacitor electrode is substantially composed of the given metal;

an adhesive layer being composed of at least of one material selected from the group consisting of ruthenium, iridium, molybdenum, a ruthenium oxide, an iridium oxide, a molybdenum oxide, Tantalum and TaN, the adhesive layer having a first part and a second part;

the first capacitor electrode being disposed on the first part of the adhesive layer and the second capacitor electrode being disposed on the second part of the adhesive layer; and the given part of the second capacitor electrode of a first one of the at least two capacitors being coherent with the given part of the second capacitor electrode of a second one of the at least two capacitors.

According to another feature of the invention, the first capacitor electrode has an upper end; the second capacitor electrode has an upper end and a lower end; the lateral faces of the first capacitor electrode of the at least two capacitors extend substantially perpendicularly with respect to the surface of the substrate and extend from the upper end of the first capacitor electrode to the lower end of the second capacitor electrode; and the lateral faces of the given part of the second capacitor electrode of the at least two capacitors extend, from the upper end of the second capacitor electrode, substantially perpendicularly with respect to the surface of the substrate.

According to yet another feature of the invention, the given part of the second capacitor electrode laterally surrounds the first capacitor electrode.

According to another feature of the invention, a filling structure is disposed between the first part of the adhesive layer and the second part of the adhesive layer; and the capacitor dielectric is disposed on the filling structure.

According to a further feature of the invention, a semiconductor component is disposed under the first capacitor electrode; the first capacitor electrode being connected to the semiconductor component; and the first capacitor electrode, the second capacitor electrode, the capacitor dielectric, and the semiconductor component forming, for each of the at least two capacitors, respective memory cell configurations.

According to another feature of the invention, the memory cell configurations are configured substantially identical to one another and form a memory cell array.

With the objects of the invention in view there is also provided, a method for producing an integrated circuit configuration including at least two capacitors, the method includes the steps of:

applying an adhesive layer on a substrate;

subsequently applying an auxiliary layer on the substrate;

forming a first depression and a second depression in the auxiliary layer such that the first depression and the second depression extend as far as the adhesive layer;

producing, with an electroplating process, a first capacitor electrode in the first depression on a first part of the adhesive layer, and at least part of a second capacitor electrode in the second depression on a second part of the adhesive layer;

removing the auxiliary layer;

subsequent to removing the auxiliary layer, removing parts of the adhesive layer, which have been exposed by removing the auxiliary layer, by an an isotropic etching step; and producing a capacitor dielectric between the first capacitor electrode and the part of the second capacitor electrode.

Another mode of the method according to the invention includes the steps of:

subsequent to removing the parts of the adhesive layer which have been exposed by removing the auxiliary layer, producing at least one filling structure such that the at least one filling structure divides the first part of the adhesive layer from the second part of the adhesive layer; and producing the capacitor dielectric on the at least one filling structure.

Another mode of the method according to the invention includes the step of producing the second depression such that the second depression laterally surrounds the first depression.

Yet another mode of the method according to the invention includes the steps of producing a semiconductor component of the integrated circuit configuration prior to producing the at least two capacitors; and producing the first capacitor electrode on the semiconductor component and connecting the first capacitor electrode to the semiconductor component.

A further mode of the method according to the invention includes the steps of producing, as the integrated circuit configuration, a memory cell configuration with substantially uniform memory cells such that at least one of the two capacitors and the semiconductor component form one of the memory cells; and producing the first depression and further first depressions and producing the second depression and further second depressions such that only parts of the auxiliary layer remain and such that the parts of the auxiliary layer laterally surround the first capacitor electrode and further first capacitor electrodes to be produced.

Another mode of the method according to the invention includes the steps of producing auxiliary structures on the auxiliary layer such that the auxiliary structures are selectively etchable with respect to the auxiliary layer and such that the auxiliary structures each cover a respective one of the first depression and the further first depressions to be produced; producing spacers on lateral faces of the auxiliary structures such that the spacers are selectively etchable with respect to the auxiliary structures and with respect to the auxiliary layer; removing the auxiliary structures selectively with respect to the spacers and with respect to the auxiliary layer; and producing the first depression, the further first depressions, the second depression and the further second depressions by etching the auxiliary layer selectively with respect to the spacers.

The object of the invention is solved through the use of an integrated circuit configuration having at least two capacitors in which the capacitor is provided on a surface of the substrate. A first capacitor electrode and at least part of a second capacitor electrode of the capacitor are provided in such a way that only lateral faces of the first capacitor electrode and of the part of the second capacitor electrode lie opposite one another. A capacitor dielectric of the capacitor is provided between the lateral faces of the first capacitor electrode and the part of the second capacitor electrode which lie opposite one another. Of the second capacitor electrode, only the part of the second capacitor electrode is composed essentially of a predefined metal. The first capacitor electrode is composed essentially of the predefined metal. The first capacitor electrode is provided on a first part of an adhesive layer and the second capacitor electrode is provided on a second part of the adhesive layer.

No part of the second capacitor electrode composed of the predefined metal is provided over the first capacitor electrode because only the aforesaid part of the second capacitor electrode is composed of the predefined metal, and this part is provided in such a way that only lateral faces, but no horizontal faces of the first capacitor electrode lie opposite one another.

The predefined metal is, for example, Ru, RuO, Ir, IrO, Mo, MoO, Ta or TaN. The first capacitor electrode and the part of the second capacitor electrode are preferably composed of platinum. In such capacitor electrodes it is possible to use capacitor dielectrics which are composed of a perovskite, for example BST or stronium-bismuth-tantalate (SBT) and have a small band gap because platinum has a very high work function. This is advantageous for increasing the capacitance of the capacitor because such materials have a high dielectric constant.

Because the first capacitor electrode and the part of the second capacitor electrode are not provided over one another, the circuit configuration can be manufactured with the method described below, which also solves the problem:

An auxiliary layer is applied to a substrate. At least a first depression and a second depression are produced in the auxiliary layer. An adhesive layer is produced at least at the bottom of the first depressions and at least at the bottom of the second depression but not on an upper surface of the auxiliary layer. A first capacitor electrode of the capacitor is produced in the first depression on a first part of the adhesive layer through the use of electroplating, and at least a part of a second capacitor electrode is produced in the second depression on a second part of the adhesive layer. The auxiliary layer is then removed. A capacitor dielectric is produced between the first capacitor electrode and the part of the second capacitor electrode.

Both the first capacitor electrode and the part of the second capacitor electrode are produced through the use of electroplating. The first capacitor electrode and the part of the second capacitor electrode may be composed of a metal which is difficult to etch without requiring a dry etching of metal which is difficult to etch in order to produce the capacitor electrodes.

Because the first capacitor electrode and the part of the second capacitor electrode are produced simultaneously, the process expenditure is particularly low.

The first depression and the second depression may have different depths so that the first capacitor electrode is provided higher than the second capacitor electrode, or vice versa.

In order to increase the capacitance of the capacitor, it is advantageous if the part of the second capacitor electrode laterally surrounds the first capacitor electrode. For this purpose, the second depression is produced in such a way that it laterally surrounds the first depression.

In order to reduce the process expenditure, it is advantageous if the second capacitor electrode is composed of only part of the second capacitor electrode. No further part of the second capacitor electrode is therefore provided. Both the first capacitor electrode and the second capacitor electrode are essentially composed in this case of the predefined metal and are produced simultaneously.

Alternatively, at least a further part of the second capacitor electrode which is not composed of the predefined metal, and in particular not of metal which is difficult to etch, is provided. The further part of the second capacitor electrode is composed, for example, of doped polysilicon or of a metal which is easy to pattern through the use of dry etching. Because the capacitor dielectric is not provided between the first capacitor electrode and the further part of the second capacitor electrode, the capacitor dielectric can be composed of BST and the further part of the second capacitor electrode can be composed of a metal with a low work function, and nevertheless no leakage currents occur.

If the part of the second capacitor electrode is provided higher than the first capacitor electrode and if the part of the second capacitor electrode surrounds the first capacitor electrode, the further part of the second capacitor electrode may be provided, for example, on the part of the second capacitor electrode and over the first capacitor electrode. In order to produce the further part of the second capacitor electrode, the first capacitor electrode can be covered by an insulating structure, and the material of the further part of the second capacitor electrode can then be deposited and removed by etching parts of the circuit configuration.

In order to simplify the process, it is advantageous if the first depression and the second depression are produced merely by anisotropic etching of the auxiliary layer. In this case, the lateral faces of the first capacitor electrode and the part of the second capacitor electrode run essentially perpendicularly with respect to the surface of the substrate. The lateral faces of the first capacitor electrode extend from an upper end of the first capacitor electrode to a lower end of the first capacitor electrode. The lateral faces of the part of the second capacitor electrode extends from an upper end of the second capacitor electrode to a lower end of the second capacitor electrode.

In order to increase the capacitance, the lateral faces of the first capacitor electrode and the part of the second capacitor electrode have bulges and cavities. For this purpose, the auxiliary layer is produced, for example, from partial layers which are alternately composed of a first material and of a second material. The first depression and the second depression are firstly produced by anisotropic etching of the auxiliary layer. The first material is then etched isotropically selectively with respect to the second material to a specific depth so that edges of the first depression and of the second depression have cavities and bulges. This shape is transferred to the shape of the first capacitor electrode and the part of the second capacitor electrode during the electroplating.

The adhesive layer is applied to the substrate before the auxiliary layer is produced, for example. The first depression and the second depression are produced in such a way that they extend only as far as the adhesive layer. The adhesive layer preferably acts as an etch stop. In particular, if the adhesive layer is composed of a conductive material, for example of Ru, RuO, Ir, IrO, Mo, MoO, Ta or TaN, it is advantageous, for the avoidance of leakage currents, to separate the first part of the adhesive layer from the second part of the adhesive layer. For this purpose, parts of the adhesive layer which are exposed after removal of the auxiliary layer are removed by anisotropic etching.

Alternatively, the adhesive layer is produced after the first depression and the second depression have been produced. In order to remove parts of the adhesive layer which are provided outside the depressions, that is to say are provided on an upper surface of the auxiliary layer, the first depression and the second depression can be filled with resist. The exposed parts of the adhesive layer are then removed.

The scope of the invention includes providing between the first part and the second part of the adhesive layer a filling structure which has a larger band gap than the capacitor dielectric in order to reduce leakage currents between the parts of the adhesive layer. The capacitor dielectric is provided on the filling structure. For this purpose, after the first part of the adhesive layer is separated from the second part of the adhesive layer, at least the filling structure which is provided between the first part and the second part of the adhesive layer, and electrically separates them from one another, is produced.

The scope of the invention includes producing a semiconductor component of the circuit configuration before the capacitor is produced. The first capacitor electrode is produced on the semiconductor component and connected to it.

The semiconductor component is, for example, a transistor.

The circuit configuration is, for example, a memory cell configuration with memory cells which are embodied in the same way. The capacitor and the semiconductor component are part of one of the memory cells.

In order to increase the packing density of the memory cell configuration it is advantageous if the second capacitor electrodes of the capacitors of the memory cells are coherent, i.e. contiguous, so that it is not necessary to make contact with them individually. Such a circuit configuration can be produced, for example, in that, when the first and the second depressions are produced, only parts of the auxiliary layer which laterally surround the first capacitor electrode, to be produced, of the capacitors of the memory cells, remain. These parts of the auxiliary layer are replaced later by the capacitor dielectric and possibly by the filling structures. The second depressions are coherent.

The memory cell configuration is, for example, a DRAM cell configuration whose memory cells each include a capacitor and a transistor connected thereto. The memory cells are connected to word lines and bit lines running transversely with respect thereto.

The memory cell configuration may also be a FRAM (ferroelectric random access memory) cell configuration. In this case, the capacitor dielectric is composed of a ferromagnetic material, for example $Pb(Zr,Ti)O_3$.

The coherent second depressions may be produced, for example, as follows:

Auxiliary structures which can be etched selectively with respect to the auxiliary layer and which each cover one of the first depressions to be produced are produced on the auxiliary layer. Spacers which can be etched selectively with respect to the auxiliary structures and with respect to the auxiliary layer are produced on lateral faces of the auxiliary structures. The auxiliary structures are removed selectively with respect to the spacers and with respect to the auxiliary layer. The auxiliary structures therefore serve as a step permitting the production of the spacers through the use of deposition and back etching of material, the spacers each surrounding one of the first depressions to be produced. The first depressions and the coherent second depressions are then produced by etching the auxiliary layer selectively with respect to the spacers.

The thickness of the spacer determines the thickness of the capacitor dielectric.

The auxiliary layer is composed, for example, of polysilicon, of $SiO_2$ or of silicon nitride.

The spacers and the filling structures are composed, for example, of $SiO_2$ or of silicon nitride.

The auxiliary structures are composed, for example, of polysilicon or of silicon nitride.

Other features which are considered as characteristic for the invention are set forth in the appended claims.

Although the invention is illustrated and described herein as embodied in an integrated circuit configuration having at least two capacitors and a method for manufacturing it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1b is a diagrammatic cross-sectional view, perpendicular with respect to the cross section in FIG. 1a, of the substrate after the process steps from FIG. 1a;

FIG. 2b is a diagrammatic cross-sectional view of the configuration shown in FIG. 1b after the process steps from FIG. 2a;

FIG. 3a is a diagrammatic cross-sectional view of the configuration shown in FIG. 2a after first capacitor electrodes of capacitors, second capacitor electrodes of the capacitors, isolators and filling structures have been produced;

FIG. 3b is a diagrammatic cross-sectional view of the configuration shown in FIG. 2b after the process steps from FIG. 3a;

FIG. 4a is a diagrammatic cross-sectional view of the configuration shown in FIG. 3a after a capacitor dielectric and a further intermediate oxide have been produced;

FIG. 4b is a diagrammatic cross-sectional view of the configuration shown in FIG. 3b after the process steps from FIG. 4a; and FIG. 4c is a plan view of the substrate in which the first capacitor electrodes, the capacitor dielectric and the second capacitor electrodes are represented.

DESCRIPTION OF THE PREFERRED EMBODIMENTS

Figure 1A:
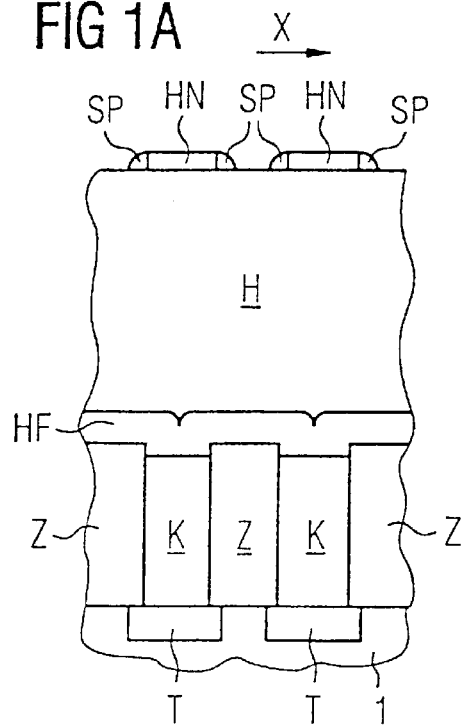
FIG. 1a is a first diagrammatic cross-sectional view of a substrate after transistors, word lines (not illustrated), bit lines (not illustrated), contacts, an intermediate oxide, an adhesive layer, an auxiliary layer, auxiliary structures and spacers have been produced according to the invention.
Figure 1B:
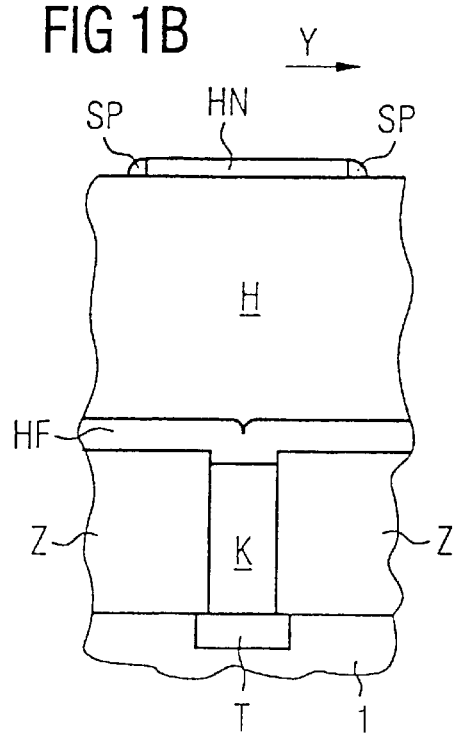

Referring now to the figures of the drawings, which are not to scale, and first, particularly, to FIG. 1 thereof, there is shown in an exemplary manner, a first substrate 1 made of silicon which is provided as the starting material. In the region of a surface of the substrate 1, transistors T are produced (see FIGS. 1a and 1b). Gate electrodes of the transistors T are connected to word lines which run parallel to an X-axis X. First source/drain regions of the transistors T are connected to bit lines which run parallel to the one Y-axis Y. The Y-axis Y runs perpendicularly with respect to the X-axis X.

An approximately 500 nm thick intermediate oxide Z made of $SiO_2$ is produced on the transistors T (see FIGS. 1a and 1b).

Contacts K to second source/drain regions of the transistors T are produced in the intermediate oxide X. The contacts K are composed of doped polysilicon. The contacts have a circular horizontal cross section with a diameter of approximately 100 nm. Contacts K which are adjacent to one another along the X-axis X are at an interval of approximately 100 nm from one another. Contacts K which are adjacent to one another along the Y-axis Y are at an interval of approximately 300 nm from one another.

The contacts K are etched back to a depth of approximately 30 nm so that an upper surface of the intermediate oxide Z lies approximately 30 nm higher than an upper surface of the contacts K. An approximately 50 nm thick adhesive layer HF of $RuO_2$ is then deposited. An approximately 500 nm thick auxiliary layer H made of $SiO_2$ is then produced over it (see FIGS. 1a and 1b).

In order to produce auxiliary structures HN, polysilicon is deposited to a thickness of approximately 100 nm and patterned through the use of a photolithographic method. A dimension of one of the auxiliary structures HN which is parallel to the X-axis X is approximately 100 nm. The dimension of the auxiliary structure HN which is parallel to the Y-axis Y is approximately 300 nm (see FIGS. 1a and 1b). The auxiliary structures HN are each provided over one of the contacts K.

In order to produce spacers SP, silicon nitride is deposited to a thickness of approximately 35 nm and etched back (see FIGS. 1a and 1b).

Figure 2A:
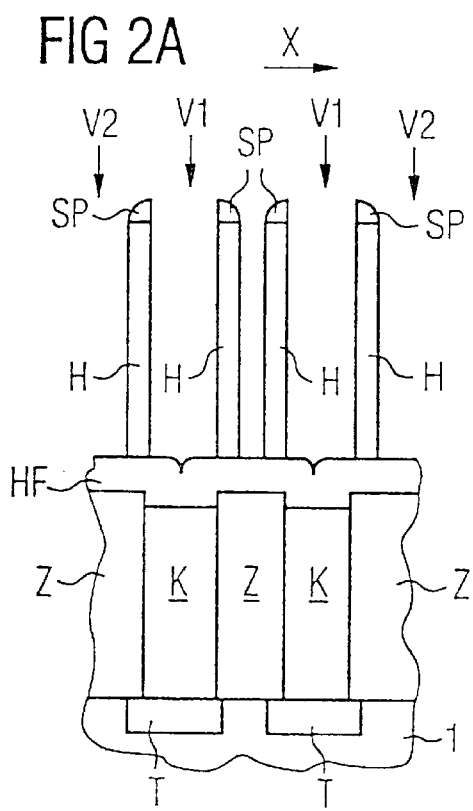
FIG. 2a is a diagrammatic cross-sectional view of the configuration of FIG. 1a after the auxiliary structures have been removed and first depressions and second depressions have been produced according to the invention.
Figure 2B:
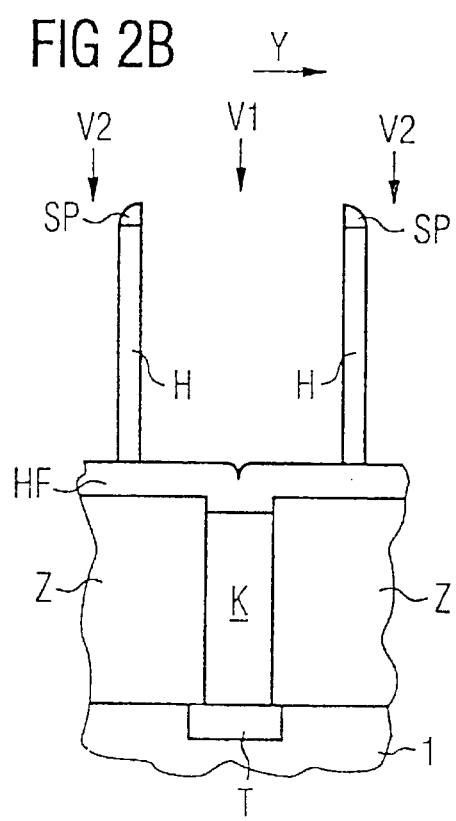

The auxiliary structures HN are then removed selectively with respect to the spacers SP and the auxiliary layer H using, for example, HBr. As a result of etching $SiO_2$ selectively with respect to the spacers SP, first depressions V1 and coherent second depressions V2 which extend as far as the adhesive layer HF (see FIGS. 2a and 2b) are produced in the auxiliary layer H. The first depressions V1 are provided under the auxiliary structures HN which are removed. Parts of the auxiliary layer H which are left surround the first depressions V1 laterally.

Through the use of electroplating, platinum is grown on the auxiliary layer HF until the first depressions V1 and the second depressions V2 are filled with platinum. As a result, first capacitor electrodes P1 of capacitors (see FIGS. 3a and 3b) are produced in the depressions V1. Coherent second capacitor electrodes P2 of the capacitors are produced in the coherent second depressions V2.

The spacers SP and the parts of the auxiliary layer H which are left are then removed. Through the use of anisotropic etching of $RuO_2$, the adhesive layer HF is patterned so that first parts of the adhesive layer HF which are provided under the first capacitor electrodes P1 are separated from second parts of the adhesive layer HF which are provided under the coherent second parts of the capacitor electrodes P2 (see FIGS. 3a and 3b).

Through the use of an HDP (High Density Plasma) process, $SiO_2$ is deposited and isotropically etched back in such a way that approximately 50 nm thick filling structures F made of SiO$_2$ are produced in between the first parts and the second parts of the adhesive layer HF. The first parts and the second parts of the adhesive layer HF are no longer exposed owing to the filling structures F. During the HDP process, insulators I are also produced on the first capacitor electrodes P1.

In order to produce a capacitor dielectric KD of the capacitors, BST is sprayed on with a Sol-Gel process and thermally compacted. The BST is then back etched until the insulators I are exposed (see FIGS. 4a, 4b and 4c). A further approximately 200 nm thick intermediate oxide Z' is then produced from SiO$_2$ (see FIGS. 4a and 4b).

In the exemplary embodiment, a DRAM cell configuration is produced whose memory cells each include one of the capacitors and one of the transistors T. The first capacitor electrodes P1 are connected to the transistors T via the contacts K.

A large number of variations of the exemplary embodiment which also lie within the scope of the invention are conceivable. For example, the dimensions of the described layers, structures and depressions can be adapted to the respective requirements. The same applies to the selection of the material.

We claim:

1. An integrated circuit configuration, comprising:
    a substrate having a surface;
    at least two capacitors provided on said surface of said substrate;
    each of said capacitors having a first capacitor electrode, a second capacitor electrode, and a capacitor dielectric;
    said first capacitor electrode and at least a given part of said second capacitor electrode having respective lateral faces, said first capacitor electrode and said second capacitor electrode being disposed such that only said respective lateral faces of said first capacitor electrode and of at least said given part of said second capacitor electrode are disposed opposite one another;
    said first capacitor electrode and said given part of said second capacitor electrode being composed of a material that is hard to etch;
    said capacitor dielectric being composed of a perovakite and being disposed between said lateral faces of said first capacitor electrode and of said given part of said second capacitor electrode disposed opposite one another;
    said first capacitor electrode being substantially composed of a given metal, said second capacitor electrode being configured such that only said given part of said second capacitor electrode is substantially composed of said given metal;
    an adhesive layer being composed of at least of one material selected from the group consisting of ruthenium, iridium, molybdenum, a ruthenium oxide, an iridium oxide, a molybdenum oxide, Tantalum and TaN, said adhesive layer having a first part and a second part;
    said first capacitor electrode being disposed on said first part of said adhesive layer and said second capacitor electrode being disposed on said second part of said adhesive layer; and
    said given part of said second capacitor electrode of a first one of said at least two capacitors being coherent with said given part of said second capacitor electrode of a second one of said at least two capacitors.

2. The circuit configuration according to claim 1, wherein:
    said first capacitor electrode has an upper end;
    said second capacitor electrode has an upper end and a lower end;
    said lateral faces of said first capacitor electrode of said at least two capacitors extend substantially perpendicularly with respect to said surface of said substrate and extend from said upper end of said first capacitor electrode to said lower end of said second capacitor electrode; and
    said lateral faces of said given part of said second capacitor electrode of said at least two capacitors extend, from said upper end of said second capacitor electrode, substantially perpendicularly with respect to said surface of said substrate.

3. The circuit configuration according to claim 1, wherein said given part of said second capacitor electrode laterally surrounds said first capacitor electrode.

4. The circuit configuration according to claim 1, wherein:
    a filling structure is disposed between said first part of said adhesive layer and said second part of said adhesive layer; and
    said capacitor dielectric is disposed on said filling structure.

5. The circuit configuration according to claim 1, including:
    a semiconductor component disposed under said first capacitor electrode;
    said first capacitor electrode being connected to said semiconductor component; and
    said first capacitor electrode, said second capacitor electrode, said capacitor dielectric, and said semiconductor component forming, for each of said at least two capacitors, respective memory cell configurations.

6. The circuit configuration according to claim 5, wherein said memory cell configurations are configured substantially identical to one another and form a memory cell array.

7. A method for producing an integrated circuit configuration including at least two capacitors, the method which comprises:
    applying an adhesive layer on a substrate, the adhesive layer being composed of at least of material selected from the group consisting of ruthenium, iridium, molybdenum, a ruthenium oxide, an iridium oxide, a molybdenum oxide, Tantalum and TaN;
    subsequently applying an auxiliary layer on the substrate;
    forming at least one first depression and at least one second depression in the auxiliary layer such that the first depression and the second depression extend as far as the adhesive layer;
    producing, with an electroplating process, a first capacitor electrode in the first depression on a first part of the adhesive layer, and at least a given part of a second capacitor electrode in the second depression on a second part of the adhesive layer, the first capacitor electrode and at least the given part of the second capacitor electrode having respective lateral faces, the first capacitor electrode and the second capacitor electrode being disposed such that only the respective lateral faces of the first capacitor electrode and of at least the given part of the second capacitor electrode are disposed opposite one another, the first capacitor electrode and the given part of the second capacitor electrode being composed of a material being hard to etch, the first capacitor electrode being substantially composed of a given metal, the second capacitor electrode being configured such that only given part of the second capacitor electrode is substantially composed of the given metal, the given part of the second capacitor electrode of a first one of the at least two capacitors being coherent with the given part of the second capacitor electrode of a second one of the at least two capacitors;

removing the auxiliary layer;

subsequent to removing the auxiliary layer, removing parts of the adhesive layer, which have been exposed by removing the auxiliary layer, by an anisotropic etching step; and producing a capacitor dielectric between the lateral faces of the first capacitor electrode and the given part of the second capacitor electrode, the capacitor dielectric being composed of a perovskite.

8. The method according to claim 7, which comprises:

subsequent to removing the parts of the adhesive layer which have been exposed by removing the auxiliary layer, producing at least one filling structure such that the at least one filling structure divides the first part of the adhesive layer from the second part of the adhesive layer; and producing the capacitor dielectric on the at least one filling structure.

9. The method according to claim 7, which comprises producing the second depression such that the second depression laterally surrounds the first depression.

10. The method according to claim 7, which comprises:

producing a semiconductor component of the integrated circuit configuration prior to producing the at least two capacitors; and producing the first capacitor electrode on the semiconductor component and connecting the first capacitor electrode to the semiconductor component.

11. The method according to claim 10, which comprises:

producing, as the integrated circuit configuration, a memory cell configuration with substantially uniform memory cells such that at least one of the two capacitors and the semiconductor component form one of the memory cells; and producing the first depression and further first depressions and producing the second depression and further second depressions such that only parts of the auxiliary layer remain and such that the parts of the auxiliary layer laterally surround the first capacitor electrode and further first capacitor electrodes to be produced.

12. The method according to claim 11, which comprises:

producing auxiliary structures on the auxiliary layer such that the auxiliary structures are selectively etchable with respect to the auxiliary layer and such that the auxiliary structures each cover a respective one of the first depression and the further first depressions to be produced;

producing spacers on lateral faces of the auxiliary structures such that the spacers are selectively etchable with respect to the auxiliary structures and with respect to the auxiliary layer;

removing the auxiliary structures selectively with respect to the spacers and with respect to the auxiliary layer; and producing the first depression, the further first depressions, the second depression and the further second depressions by etching the auxiliary layer selectively with respect to the spacers.

* * * * *